(12) United States Patent
Cui

(10) Patent No.: US 11,937,461 B2
(45) Date of Patent: Mar. 19, 2024

(54) ARRAY SUBSTRATE, METHOD OF MANUFACTURING THE SAME, DISPLAY PANEL AND DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 226 days.

(21) Appl. No.: 17/487,296

(22) Filed: Sep. 28, 2021

(65) Prior Publication Data

US 2022/0278181 A1 Sep. 1, 2022

(30) Foreign Application Priority Data

Feb. 26, 2021 (CN) .......................... 202110222623.3

(51) Int. Cl.
*H01L 27/32* (2006.01)
*H01L 51/52* (2006.01)
(Continued)

(52) U.S. Cl.
CPC ........... *H10K 59/122* (2023.02); *H10K 50/80* (2023.02); *H10K 71/00* (2023.02);
(Continued)

(58) Field of Classification Search
CPC .................................................... H10K 59/122
See application file for complete search history.

(56) References Cited

U.S. PATENT DOCUMENTS 10,707,273 B2 * 7/2020 Madigan ................ H10K 50/11
11,276,735 B2 3/2022 Xie et al.
(Continued)

FOREIGN PATENT DOCUMENTS

| CN | 109713007 A | 5/2019 | |
|---|---|---|---|
| WO | WO2016103970 A1 * | 6/2013 | ............. H05B 33/12 |
| WO | 2016103970 A1 | 6/2016 | |

OTHER PUBLICATIONS

Machine translation, Takagi, WIPO Pat. Pub. No. WO2016103970A1, translation date: Aug. 24, 2023, Espacenet, all pages. (Year: 2023).*

(Continued)

*Primary Examiner* — Victoria K. Hall

(74) *Attorney, Agent, or Firm* — Westman, Champlin & Koehler, P.A.

(57) ABSTRACT

An array substrate, including: a plurality of first pixel defining portions and a plurality of second pixel defining portions arranged on a base substrate and jointly define a plurality of pixel openings; and a light emitting functional layer arranged on the base substrate and includes a first light emitting portion and a second light emitting portion that emit different colors of light, at least a part of the first light emitting portion and the second light emitting portion is respectively located in a first pixel opening and a second pixel opening. An orthographic projection of a combination of two adjacent pixel openings separated by the second pixel defining portion on a base substrate has a first size in a first direction and a second size in a second direction, and a ratio of the first size to the second size is within a range of 0.8 to 1.2.

14 Claims, 5 Drawing Sheets

(51) Int. Cl.
  *H01L 51/56*    (2006.01)
  *H10K 50/80*    (2023.01)
  *H10K 59/122*   (2023.01)
  *H10K 71/00*    (2023.01)
  *H10K 59/12*    (2023.01)
  *H10K 59/35*    (2023.01)
  *H10K 71/12*    (2023.01)
  *H10K 71/13*    (2023.01)
  *H10K 71/16*    (2023.01)

(52) U.S. Cl.
  CPC ......... *H10K 59/1201* (2023.02); *H10K 59/35* (2023.02); *H10K 71/12* (2023.02); *H10K 71/135* (2023.02); *H10K 71/164* (2023.02)

(56) References Cited

U.S. PATENT DOCUMENTS

| | | | |
|---|---|---|---|
| 2009/0195144 A1* | 8/2009 | Kitabayashi ......... | H10K 50/805 |
| | | | 313/503 |
| 2011/0220921 A1 | 9/2011 | Tamura et al. | |
| 2014/0197396 A1* | 7/2014 | Madigan ............. | H10K 71/135 |
| | | | 438/34 |
| 2018/0166510 A1* | 6/2018 | Lee ........................ | H10K 59/35 |
| 2021/0335907 A1* | 10/2021 | Xie ...................... | H10K 71/135 |
| 2023/0131455 A1* | 4/2023 | Bing .................... | H10K 71/135 |
| | | | 257/89 |

OTHER PUBLICATIONS

First Office Action, including Search Report, for Chinese Patent Application No. 202110222623.3, dated Apr. 8, 2022, 22 pages.

\* cited by examiner

ARRAY SUBSTRATE, METHOD OF MANUFACTURING THE SAME, DISPLAY PANEL AND DISPLAY DEVICE

CROSS REFERENCE

This application claims the benefit of Chinese Patent Application No. 202110222623.3 filed on Feb. 26, 2021 in the State Intellectual Property Office of China, the whole disclosure of which is incorporated herein by reference.

TECHNICAL FIELD

The present disclosure relates to a field of display technology, and in particular to an array substrate, a method of manufacturing an array substrate, a display panel, and a display device.

BACKGROUND

At present, an inkjet printing process may be used to prepare various types of display devices. For example, in a process of manufacturing an organic light emitting diode (OLED) display device, an organic luminescent material may be dissolved into "ink", and then less than tens of pl (one trillionth of a liter) of the "ink" may be sprayed directly on a surface of a substrate, so as to form organic light emitting layers of various colors such as red (R), green (G), and blue (B).

SUMMARY

In an aspect, an array substrate is provided, including: a base substrate; a plurality of first electrodes arranged on the base substrate, wherein the plurality of first electrodes are spaced apart from each other; a plurality of first pixel defining portions arranged on the base substrate; a plurality of second pixel defining portions arranged on the base substrate, wherein the plurality of first pixel defining portions and the plurality of second pixel defining portions jointly define a plurality of pixel openings including at least a first pixel opening and a second pixel opening, and orthographic projections of the plurality of pixel openings on the base substrate are respectively located within orthographic projections of the plurality of first electrodes on the base substrate; and a light emitting functional layer arranged on the base substrate, wherein the light emitting functional layer includes at least a first light emitting portion and a second light emitting portion that emit different colors of light, at least a part of the first light emitting portion is located in the first pixel opening, and at least a part of the second light emitting portion is located in the second pixel opening; wherein at least one of the plurality of first pixel defining portions is located between a first pixel opening and a second pixel opening that are adjacent in a first direction, and at least one of the plurality of second pixel defining portions is located between two first pixel openings that are adjacent in the first direction or is located between two second pixel openings that are adjacent in the first direction; and wherein an orthographic projection of a combination of two adjacent pixel openings separated by the second pixel defining portion on the base substrate has a first size in the first direction and a second size in a second direction different from the first direction, and a ratio of the first size to the second size is within a range of 0.8 to 1.2.

According to some exemplary embodiments, the base substrate has a first surface facing the plurality of first electrodes, the first pixel defining portion has a first height in a direction perpendicular to the first surface, the second pixel defining portion has a second height in the direction perpendicular to the first surface, and the first height is greater than the second height.

According to some exemplary embodiments, an orthographic projection of a combination of the second pixel defining portion and two adjacent pixel openings separated by the second pixel defining portion on the substrate has a shape of a rhombus or a square.

According to some exemplary embodiments, the array substrate further includes a plurality of third pixel defining portions, wherein at least one of the third pixel defining portions is located between two first pixel openings that are adjacent in a third direction or is located between two second pixel openings that are adjacent in the third direction, the third direction is different from the first direction and the second direction; and wherein the third pixel defining portion has a third height in the direction perpendicular to the first surface, and the first height is greater than the third height.

According to some exemplary embodiments, a ratio of the third height to the second height is within a range of 0.8 to 1.2.

According to some exemplary embodiments, an orthographic projection of each of the first pixel opening and the second pixel opening on the base substrate has a long side extending in the second direction and a short side extending in the first direction; and wherein the first size is equal to a sum of lengths of the short sides of two adjacent first pixel openings or two adjacent second pixel openings, and the second size is equal to a length of the long side of the first pixel opening or the second pixel opening.

According to some exemplary embodiments, orthographic projections of the plurality of first pixel defining portions on the base substrate extend continuously and have a bent shape; or wherein an orthographic projection of each of the second pixel defining portions on the base substrate is in a strip shape extending in the second direction; or wherein an orthographic projection of each of the third pixel defining portions on the base substrate is in a strip shape extending in the third direction.

According to some exemplary embodiments, the first pixel defining portions and the second pixel defining portions are alternately arranged in the first direction; or wherein the first pixel defining portions and the second pixel defining portions are alternately arranged in the second direction.

According to some exemplary embodiments, the plurality of pixel openings further include a third pixel opening, the light emitting functional layer further includes a third light emitting portion, the first light emitting portion, the second light emitting portion and the third light emitting portion emit different colors of light, and at least a part of the third light emitting portion is located in the third pixel opening; and wherein at least one of the first pixel defining portions is arranged between any adjacent two of the first pixel opening, the second pixel opening and the third pixel opening.

According to some exemplary embodiments, the array substrate includes a first opening group, a second opening group, and a third opening group; wherein the first opening group includes two first pixel openings that are adjacent in the first direction, and at least one of the second pixel defining portions is arranged between the two first pixel openings in the first opening group in the first direction; wherein the second opening group includes two second pixel openings that are adjacent in the first direction, and at least one of the second pixel defining portions is arranged between the two second pixel openings in the second opening group in the first direction; wherein the third opening group includes two third pixel openings that are adjacent in the first direction, and at least one of the second pixel defining portions is arranged between the two third pixel openings in the third opening group in the first direction; and wherein in the first direction, the first pixel defining portion is arranged between any adjacent two of the first opening group, the second opening group and the third opening group.

According to some exemplary embodiments, in the third direction, the third pixel defining portion is arranged between two adjacent first opening groups; or wherein in the third direction, the third pixel defining portion is arranged between two adjacent second opening groups; or wherein in the third direction, the third pixel defining portion is arranged between two adjacent third opening groups.

According to some exemplary embodiments, in a fourth direction perpendicular to the third direction, the first pixel defining portion is arranged between the third pixel defining portion and each of the first opening group, the second opening group and the third opening group.

According to some exemplary embodiments, a size of the first pixel defining portion in the first direction is greater than a size of the second pixel defining portion in the first direction; or a size of the third pixel defining portion in the fourth direction is greater than the size of the second pixel defining portion in the first direction; or the size of the third pixel defining portion in the fourth direction is 1 to 6 times the size of the first pixel defining portion in the first direction.

In another aspect, a display panel is provided, including the array substrate described above.

In another aspect, a display device is provided, including the display panel described above.

In yet another aspect, a method of manufacturing an array substrate is provided, including: forming a plurality of first electrodes on a base substrate, wherein the plurality of first electrodes are spaced apart from each other; forming a plurality of first pixel defining portions and a plurality of second pixel defining portions on the base substrate, so that the plurality of first pixel defining portions and the plurality of second pixel defining portions jointly define a plurality of pixel openings; and forming a light emitting functional layer in each of the pixel openings by using an inkjet printing process, wherein orthographic projections of the plurality of pixel openings on the base substrate are respectively located in orthographic projections of the plurality of first electrodes on the base substrate, the plurality of pixel openings include at least a first pixel opening and a second pixel opening, the light emitting functional layer includes at least a first light emitting portion and a second light emitting portion that emit different colors of light, at least a part of the first light emitting portion is located in the first pixel opening, and at least a part of the second light emitting portion is located in the second pixel opening; wherein at least one of the plurality of first pixel defining portions is located between a first pixel opening and a second pixel opening that are adjacent in a first direction, and at least one of the plurality of second pixel defining portions is located between two first pixel openings that are adjacent in the first direction or is located between two second pixel openings that are adjacent in the first direction; and wherein an orthographic projection of a combination of two adjacent pixel openings separated by the second pixel defining portion on the base substrate has a first size in the first direction and a second size in a second direction different from the first direction, and a ratio of the first size to the second size is within a range of 0.8 to 1.2.

BRIEF DESCRIPTION OF THE DRAWINGS

In order to more clearly illustrate the technical solutions in the embodiments of the present disclosure or in the related art, drawings required in the description of the embodiments or the related art are briefly introduced below. The drawings in the following description illustrate only some embodiments of the present disclosure. For those of ordinary skill in the art, other drawings may be obtained from these drawings without carrying out any inventive effort.

DETAILED DESCRIPTION OF EMBODIMENTS

Figure 1:
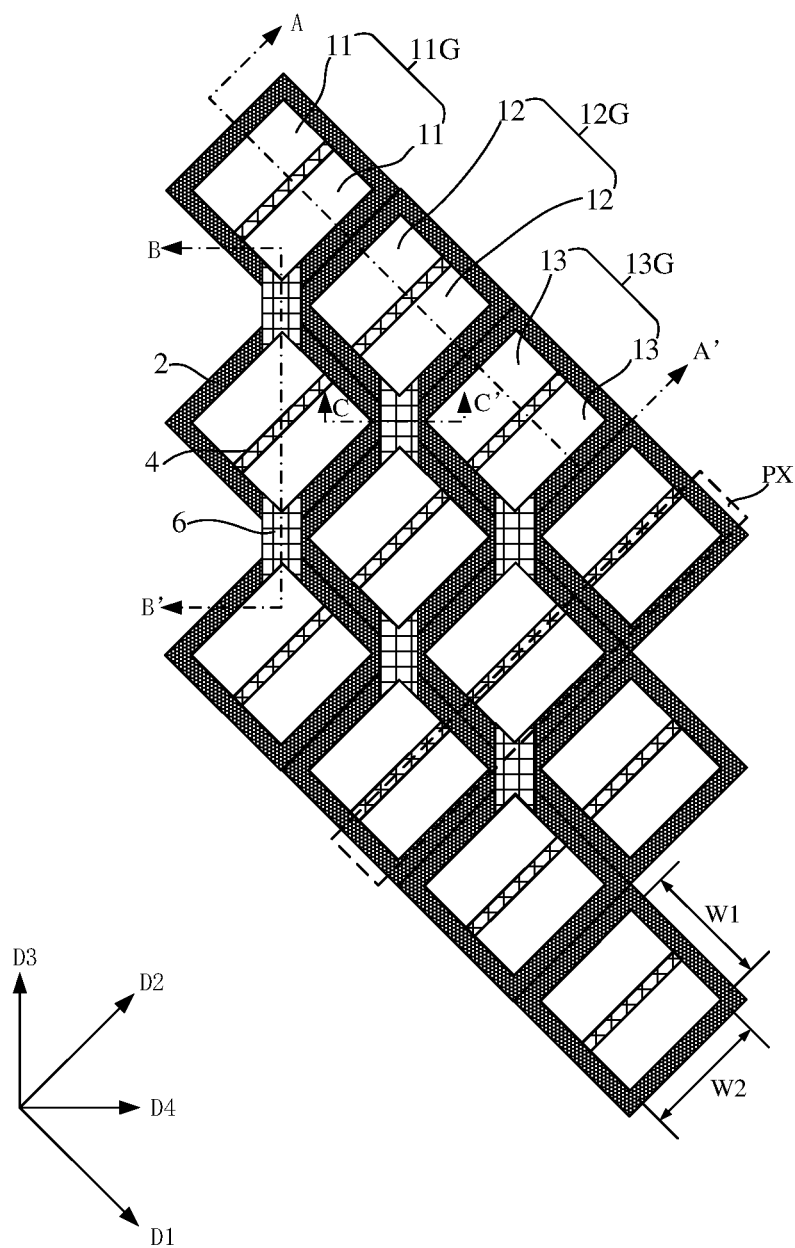
FIG. 1 shows a schematic plan view of an array substrate according to some embodiments of the present disclosure.

In the following description, for the purpose of explanation, many specific details are set forth to provide a comprehensive understanding of various exemplary embodiments. However, it is obvious that the various exemplary embodiments may be implemented without these specific details or with one or more equivalent arrangements. In other cases, well-known structures and devices are shown in block diagrams in order to avoid unnecessarily obscuring the various exemplary embodiments. In addition, the various exemplary embodiments may be different, but need not be exclusive. For example, without departing from the inventive concept, specific shapes, configurations and characteristics of an exemplary embodiment may be used or implemented in another exemplary embodiment.

In the drawings, for clarity and/or description purposes, sizes and relative sizes of elements may be enlarged. Accordingly, the size and relative size of each element need not be limited to those shown in the drawings. When the exemplary embodiments may be implemented differently, a specific process sequence may be different from the sequence described. For example, two consecutively described processes may be performed substantially simultaneously or in a reverse order. In addition, the same reference numerals represent the same elements.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. As used herein, the term "and/or" includes any and all combinations of one or more of the listed related items.

It should be understood that, although terms "first," "second" and so on may be used herein to describe different elements, these elements should not be limited by these terms. These terms are only used to distinguish one element from another element. For example, without departing from the scope of the exemplary embodiments, a first element may be named as a second element, and similarly, a second element may be named as a first element.

For the purpose of description, spatial relative terms such as "under", "below", "lower", "on", "above", "upper", "higher" or "side" (for example, in a "side wall"), etc. may be used herein to describe a relationship between one element and another (or other) element(s) as shown in the drawings. In addition to the orientation depicted in the drawings, the spatial relative terms are also intended to encompass different orientations of the device in use, operation, and/or manufacture. For example, if the device in the drawings is turned over, an element described as being "under" or "below" other elements or features may then be oriented "on" or "above" the other elements or features. Therefore, the exemplary term "below" may encompass two orientations including above and below. In addition, the device may be otherwise positioned (for example, rotated by 90 degrees or in other orientations), so that the spatial relative terms used herein are explained accordingly.

Moreover, when the term "include" is used in this specification, the term indicates a presence of stated features, wholes, steps, operations, elements, components and/or groups thereof, but does not exclude a presence or addition of one or more other features, other wholes, other steps, other operations, other elements, other components and/or groups thereof. It should also be noted that, as used herein, the terms "substantially", "about" and other similar terms are used as approximation terms rather than degree terms. Thus, the terms "substantially", "about" and other similar terms are used to describe an inherent deviation of a measured value, a calculated value, and/or a provided value that those of ordinary skilled in the art may recognize.

Here, unless otherwise clearly defined, the term "continuously extending" means that one component extends from another component, or that the two components are formed as a whole.

Those skilled in the art should understand that herein, unless otherwise specified, the expression "height" refers to a size in a direction perpendicular to a surface of the display substrate provided with various film layers (for example, a color filter substrate or an array substrate), that is, a size in a light exit direction of the display substrate.

The embodiments of the present disclosure provide an array substrate, a method of manufacturing an array substrate, a display panel, and a display device. The array substrate may include: a base substrate; a plurality of first electrodes arranged on the base substrate, wherein the plurality of first electrodes are spaced apart from each other; a plurality of first pixel defining portions arranged on the base substrate; a plurality of second pixel defining portions arranged on the base substrate, wherein the plurality of first pixel defining portions and the plurality of second pixel defining portions jointly define a plurality of pixel openings including at least a first pixel opening and a second pixel opening, and orthographic projections of the plurality of pixel openings on the base substrate are respectively located within orthographic projections of the plurality of first electrodes on the base substrate; and a light emitting functional layer arranged on the base substrate, wherein the light emitting functional layer includes at least a first light emitting portion and a second light emitting portion that emit different colors of light, at least a part of the first light emitting portion is located in the first pixel opening, and at least a part of the second light emitting portion is located in the second pixel opening; at least one of the plurality of first pixel defining portions is located between a first pixel opening and a second pixel opening that are adjacent in a first direction, and at least one of the plurality of second pixel defining portions is located between two first pixel openings that are adjacent in the first direction or is located between two second pixel openings that are adjacent in the first direction; an orthographic projection of a combination of two adjacent pixel openings separated by the second pixel defining portion on the base substrate has a first size in the first direction and a second size in a second direction different from the first direction, and a ratio of the first size to the second size is within a range of 0.8 to 1.2. In this way, film formation uniformity of the light emitting functional layer in each pixel opening may be improved, so that a quality and a lifetime of a display device may be improved.

The embodiments of the present disclosure provide a display device. A type of the display device is not limited, and it may be an electroluminescent display device. For example, the electroluminescent display device may be an organic electroluminescent display device (e.g., Organic Light Emitting Diode (OLED for short)) or a Quantum Dot electroluminescent display device (e.g., Quantum Dot Light Emitting Diode (QLED for short)).

It should be noted that in the following description, an OLED display device is mainly illustrated by way of example to describe various embodiments of the present disclosure. However, the embodiments of the present disclosure are not limited to the following exemplary embodiments.

For example, when manufacturing an organic light emitting diode, a light emitting functional layer may be formed by the following methods, including: (1) a method of vacuum evaporation suitable for small organic molecules, which may form the light emitting functional layer without the use of solvent and achieve a uniform film thickness, but which is not suitable for a production of large-size products due to large equipment investment and low material utilization; (2) a method of forming the light emitting functional layer by using a solution of an organic luminescent material, including spin coating, inkjet printing, etc., which is suitable for polymer materials and small soluble molecules, and which has outstanding advantages in a large-scale production of large-size products due to low equipment cost. When the light emitting functional layer is formed by inkjet printing, a pixel defining layer needs to be formed on the base substrate in advance, so as to limit ink droplets to be precisely sprayed into a light emitting region of a designated pixel. Generally, the pixel defining layer mentioned above may have a plurality of openings. In a process of inkjet printing, the solution may be precisely inkjet printed into the openings of the pixel defining layer so as to form the light emitting functional layer. However, in the related art, a diffusion of the ink in the opening may be uneven, so that the light emitting layer formed at different positions of the opening may have an uneven thickness. Especially, when the opening has unequal side lengths, for example, when the opening has a long side and a short side having a width less than a width of the long side, a diffusion of ink droplets has a lower uniformity at the short side than an uniformity at the long side. This may result in an uneven pixel brightness when the display device emits light, which may seriously affect a display effect of the display device.

Figure 2:
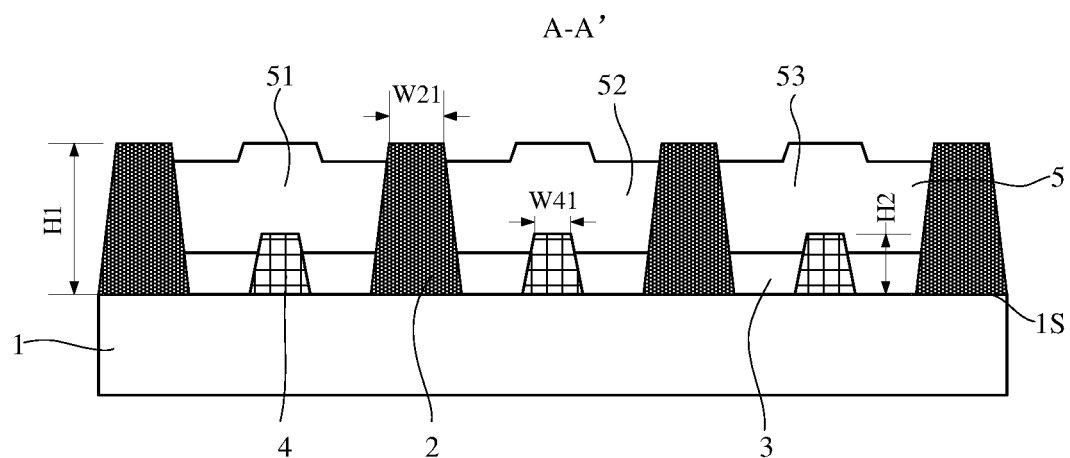
FIG. 2 shows a cross-sectional view of the array substrate according to some embodiments of the present disclosure taken along line AA' in FIG. 1.
Figure 3:
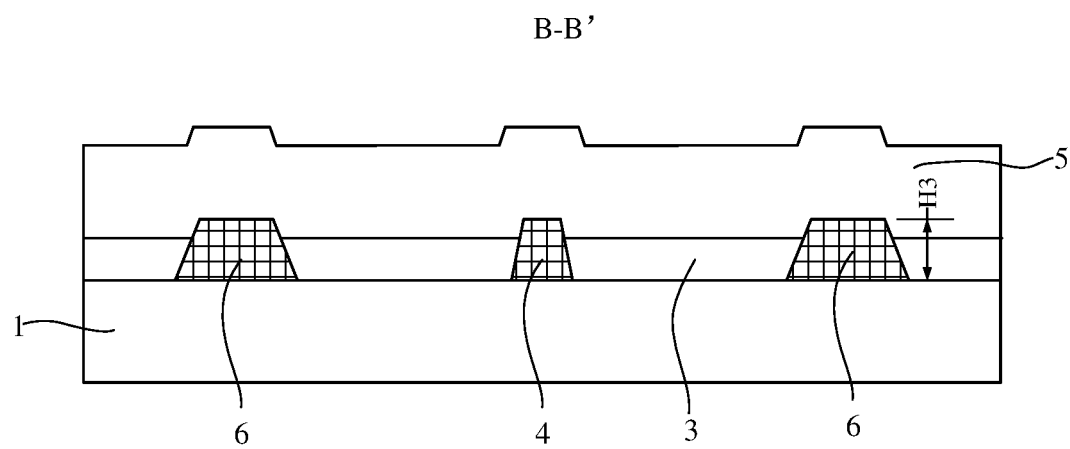
FIG. 3 shows a cross-sectional view of the array substrate according to some embodiments of the present disclosure taken along line BB' in FIG. 1.
Figure 4:
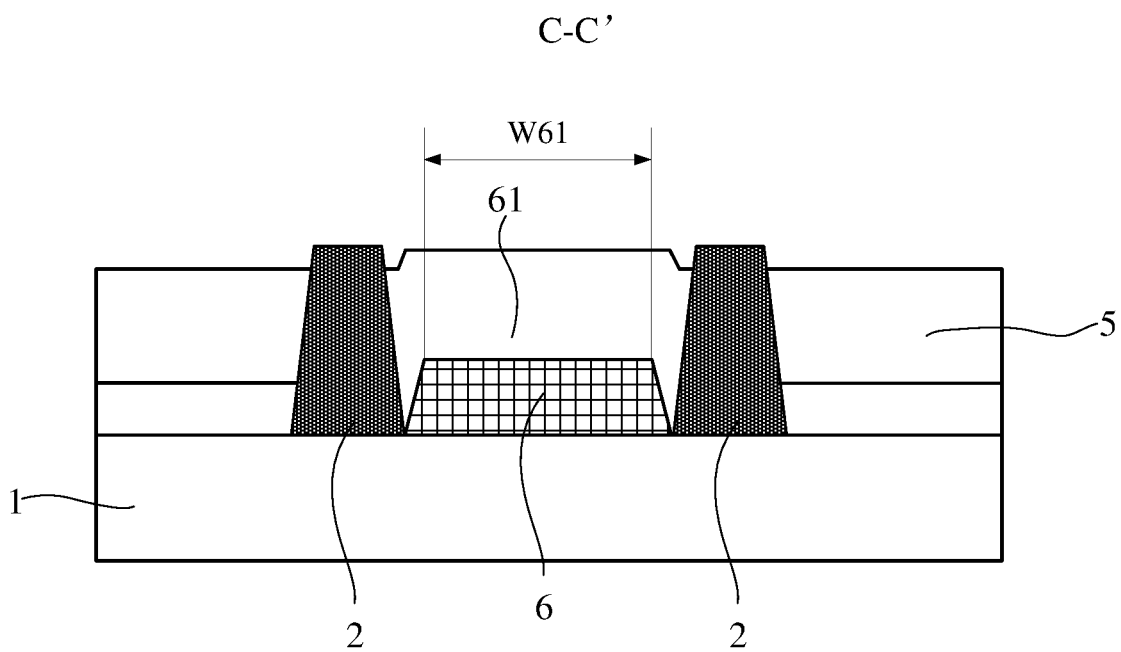
FIG. 4 shows a cross-sectional view of the array substrate according to some embodiments of the present disclosure taken along line CC' in FIG. 1.

FIG. 1 shows a schematic plan view of an array substrate according to some embodiments of the present disclosure. FIG. 2 shows a cross-sectional view of the array substrate according to some embodiments of the present disclosure taken along line AA' in FIG. 1. FIG. 3 shows a cross-sectional view of the array substrate according to some embodiments of the present disclosure taken along line BB' in FIG. 1. FIG. 4 shows a cross-sectional view of the array substrate according to some embodiments of the present disclosure taken along line CC' in FIG. 1.

Referring to FIG. 1 to FIG. 4 in combination, an array substrate 100 according to the embodiments of the present disclosure may include: a base substrate 1; a plurality of first electrodes 3 arranged on the base substrate 1, wherein the plurality of first electrodes 3 are spaced apart from each other; a plurality of first pixel defining portions 2 arranged on the base substrate 1; a plurality of second pixel defining portions 4 arranged on the base substrate 1; and a light emitting functional layer 5 arranged on the base substrate 1.

For example, the plurality of first pixel defining portions 2 and the plurality of second pixel defining portions 4 jointly define a plurality of pixel openings. Orthographic projections of the plurality of pixel openings on the base substrate 1 are respectively located within orthographic projections of the plurality of first electrodes 3 on the base substrate 1. For example, the plurality of pixel openings may include at least a first pixel opening 11 and a second pixel opening 12.

For example, the light emitting functional layer 5 includes at least a first light emitting portion 51 and a second light emitting portion 52 that emit different colors of light. At least a part of the first light emitting portion 51 is located in the first pixel opening 11, and at least a part of the second light emitting portion 52 is located in the second pixel opening 12.

Referring to FIG. 1, at least one of the plurality of first pixel defining portions 2 is located between a first pixel opening 11 and a second pixel opening 12 that are adjacent in a first direction D1, and at least one of the plurality of second pixel defining portions 4 is located between two first pixel openings 11 that are adjacent in the first direction D1 or is located between two second pixel openings 12 that are adjacent in the first direction D1.

Continuing to refer to FIG. 1, an orthographic projection of a combination of two adjacent pixel openings (two adjacent first pixel openings 11 or two adjacent second pixel openings 12) separated by the second pixel defining portion 4 on the base substrate 1 may have a first size W1 in the first direction D1 and a second size W2 in a second direction D2. A ratio of the first size W1 to the second size W2 is within a range of 0.8 to 1.2. In other words, the first size W1 is substantially equal to the second size W2.

The first direction D1 is different from the second direction D2. For example, the first direction D1 may be substantially perpendicular to the second direction D2.

In the array substrate provided by the embodiments of the present disclosure, when the light emitting layer is formed in the pixel opening by using the inkjet printing process, the light emitting layers in different colors may be separated by the first pixel defining portions, and a material of the light emitting layers in a same color may flow between adjacent pixel openings. By setting the first size to be substantially equal to the second size, a diffusion range of the luminescent material may be increased, so that the film formation uniformity of the light emitting layer may be improved, and then the display effect of the display device may be improved.

For example, referring to FIG. 2 to FIG. 4, the base substrate 1 has a first surface 1S (that is, an upper surface in FIG. 2) facing the plurality of electrodes 3. The first pixel defining portion 2 has a first height H1 in a direction perpendicular to the first surface, the second pixel defining portion 4 has a second height H2 in the direction perpendicular to the first surface, and the first height H1 is greater than the second height H2.

For example, referring to FIG. 1, an orthographic projection of a combination of the second pixel defining portion 4 and two adjacent pixel openings (for example, two adjacent pixel openings 11 or two adjacent pixel openings 12) separated by the second pixel defining portion 4 on the base substrate 1 has a shape of a rhombus or a square.

For example, the pixel opening 11, 12 has a long side and a short side. Exemplarily, the orthographic projection of the pixel opening 11, 12 on the base substrate 1 has a shape of a rectangle, a long side of the rectangle may be used as the long side of the pixel opening, and a short side of the rectangle may be used as the short side of the pixel opening.

For example, the orthographic projection of each of the first pixel opening 11 and the second pixel opening 12 on the base substrate 1 has a shape of a rectangle which has a long side extending in the second direction D2 and a short side extending in the first direction D1.

The first size W1 is equal to a sum of lengths of the short sides of two adjacent first pixel openings 11 or two adjacent first pixel openings 12, and the second size W2 is equal to a length of the long side of a first pixel opening 11 or a second pixel opening 12.

Orthographic projections of the plurality of first pixel defining portions 2 on the base substrate 1 may extend continuously and have a bent shape.

An orthographic projection of each of the second pixel defining portions 4 on the base substrate 1 is in a strip shape extending in the second direction D2. That is, the second pixel defining portion 4 extends in a long side direction of the pixel opening.

An orthographic projection of each of the third pixel defining portions 6 on the base substrate 1 is in a strip shape extending in a third direction D3.

In the first direction D1, the first pixel defining portions 2 and the second pixel defining portions 4 are alternately arranged. In the second direction D2, the first pixel defining portions 2 and the second pixel defining portions 4 are alternately arranged.

For example, referring to FIG. 1, two ends of the second pixel defining portion 4 in the second direction D2 are respectively aligned with the short sides of the pixel openings separated by the second pixel defining portion 4. In this way, a range of the luminescent material diffusing along the short side of the pixel opening may be increased.

It should be understood that in practice, the pixel openings may also have other shapes, which may be designed and determined according to an actual application environment and are not limited here.

In the array substrate provided by the embodiments of the present disclosure, when the light emitting layer is formed in the pixel opening by using the inkjet printing process, the light emitting layers in different colors may be separated by the first pixel defining portion. Since the second height of the second pixel defining portion is relatively low, the material of the light emitting layer in the same color may flow between adjacent pixel openings, which is equivalent to increasing the diffusion range of the luminescent material, so that the film formation uniformity of the light emitting layer may be improved, and then the display effect of the display device may be improved.

Figure 5:
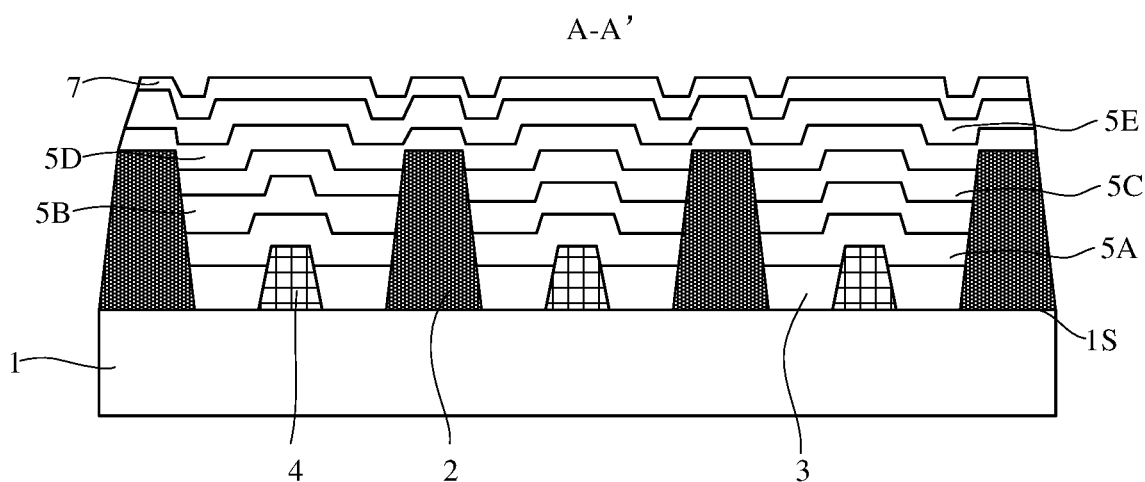
FIG. 5 shows a cross-sectional view of the array substrate according to some embodiments of the present disclosure taken along line AA' in FIG. 1.

FIG. 5 shows a cross-sectional view of the array substrate according to some embodiments of the present disclosure taken along line AA' in FIG. 1. Referring to FIG. 5, in some exemplary embodiments, the array substrate may further include a second electrode 7 arranged on a side of the light emitting functional layer 5 away from the base substrate 1. In this way, the first electrode 3, the light emitting functional layer 5 and the second electrode 7 may form a stacked structure to form an electroluminescent diode. Exemplarily, the material of the light emitting functional layer may be an organic electroluminescent material, so that the electroluminescent diode may be an organic light emitting diode. The material of the light emitting layer may also be a quantum dot electroluminescent material, so that the electroluminescent diode may be a quantum dot light emitting diode. It should be noted that the region where the pixel opening is located is a light emitting region of a sub-pixel where the electroluminescent diode is located.

For example, in some exemplary embodiments, the array substrate may further include a circuit structure layer arranged between a layer where the first electrode 3 is located and the base substrate 1. The circuit structure layer may include a plurality of pixel driving circuits. The first electrode 3 is electrically connected to the pixel driving circuit, so that a driving current may be input to the first electrode 3 through the pixel driving circuit, and a corresponding voltage may be applied to the second electrode 7 so as to drive the light emitting layer to emit light. Exemplarily, the pixel driving circuit may include a storage capacitor and a transistor electrically connected to the storage capacitor. For example, the pixel driving circuit may include at least one of a 2T1C pixel driving circuit, a 3T1C pixel driving circuit or a 7T1C pixel driving circuit. In practice, a structure of the pixel driving circuit may be substantially the same as a structure in the related art, which will not be repeated here.

Referring back to FIG. 1, the array substrate 100 may further include a third pixel defining portion 6. At least one of the third pixel defining portions 6 is located between two first pixel openings 11 adjacent in the third direction D3 or is located between two second pixel openings 12 adjacent in the third direction D3.

The third direction D3 is different from the first direction D1 and the second direction D2. For example, the third direction D3 may be a vertical direction in FIG. 1, and an angle between the third direction D3 and the second direction D2 may be about 45°.

For example, referring to FIG. 3, the third pixel defining portion 6 has a third height H3 in the direction perpendicular to the first surface 1S, and the first height H1 is greater than the third height H3. Exemplarily, a ratio of the third height H3 to the second height H2 is within a range of 0.8 to 1.2. In other words, the third height H3 may be substantially equal to the second height H2.

For example, the first height H1 may be in a range of 1.2 microns to 2.0 microns, and each of the second height H2 and the third height H3 may be in a range of 0.3 microns to 0.6 microns.

Referring to FIG. 1 to FIG. 4, the plurality of pixel openings may further include a third pixel opening 13, and the light emitting functional layer may further include a third light emitting portion 53. The first light emitting portion 51, the second light emitting portion 52 and the third light emitting portion 53 emit different colors of light. At least a part of the third light emitting portion 53 is located in the third pixel opening 13. For example, the first light emitting portion 51, the second light emitting portion 52 and the third light emitting portion 53 may emit red light, green light and blue light, respectively.

At least one of the first pixel defining portions 2 is arranged between any adjacent two of the first pixel opening 11, the second pixel opening 12 and the third pixel opening 13.

For example, the array substrate 100 may include a first opening group 11G, a second opening group 12G, and a third opening group 13G. The first opening group 11G may include two first pixel openings 11 that are adjacent in the first direction D1, and at least one of the second pixel defining portions 4 is arranged between the two first pixel openings 11 in the first opening group 11G in the first direction D1. The second opening group 12G may include two second pixel openings 12 that are adjacent in the first direction D1, and at least one of the second pixel defining portions 4 is arranged between the two second pixel openings 12 in the second opening group 12G in the first direction D1. The third opening group 13G may include two third pixel openings 13 that are adjacent in the first direction D1, and at least one of the second pixel defining portions 4 is arranged between the two third pixel openings 13 in the third opening group 13G in the first direction D1. In the embodiments of the present disclosure, the light emitting portions arranged in two pixel openings in one opening group emit same color of light. For example, two first light emitting portions 51 for emitting red light are provided in the first opening group 11G, two second light emitting portions 52 for emitting green light are provided in the second opening group 12G, and two third light emitting portions 53 for emitting blue light are provided in the third opening group 13G. Two pixel openings in an opening group are separated by the second pixel defining portion 4. As described above, the height of the second pixel defining portion 4 is relatively small, so that when the light emitting functional layer is formed by the inkjet printing process, the luminescent material of the same color may flow between the two pixel openings in the same opening group, which may enlarge a range where the material flows, which is beneficial to improve the film formation uniformity.

Referring to FIG. 1, in the first direction D1, the first pixel defining portion 2 is arranged between any adjacent two of the first opening group 11G, the second opening group 12G, and the third opening group 13G. For example, the first light emitting portion 51 for emitting red light is provided in the first opening group 11G, the second light emitting portion 52 for emitting green light is provided in the second opening group 12G, and the third light emitting portion 53 for emitting blue light is provided in the third opening group 13G. The first pixel defining portion 2 is provided between the light emitting portions that emit different colors of light. As described above, the height of the first pixel defining portion 2 is relatively large, so that when the light emitting functional layer is formed by the inkjet printing process, the luminescent material of different colors may be prevented from flowing into an adjacent opening group.

The third pixel defining portion 6 is provided between a plurality of opening groups including the light emitting portions for emitting the same color of light. Referring to FIG. 1, in the third direction D3, the third pixel defining portion 6 is arranged between two adjacent first opening groups 11G. In the third direction D3, the third pixel defining portion 6 is arranged between two adjacent second opening groups 12G. In the third direction D3, the third pixel defining portion 6 is arranged between two adjacent third opening groups 13G. As described above, the height of the third pixel defining portion 6 is relatively small, so that when the light emitting functional layer is formed by the inkjet printing process, the luminescent material of the same color may flow between the plurality of pixel openings in the plurality of opening groups including the light emitting portions for emitting the same color of light, which may enlarge a range where the material flows, which is beneficial to improve the film formation uniformity.

Referring to FIG. 1 and FIG. 4 in combination, in a fourth direction D4, the first pixel defining portion 2 is arranged between the third pixel defining portion 6 and each of the first opening group 11G, the second opening group 12G and the third opening group 13G.

For example, the fourth direction D4 is substantially perpendicular to the third direction D3. The fourth direction D4 may be a horizontal direction in FIG. 1, and an angle between the fourth direction D4 and the second direction D2 may be about 45°.

In the embodiment shown in FIG. 1, a plurality of opening groups including the light emitting portions for emitting the same color of light are arranged in the third direction D3. Accordingly, in the fourth direction D4, a plurality of opening groups including the light emitting portions for emitting different colors of light are arranged alternately. Through the above arrangement, the first pixel defining portion 2 which is relatively high may be arranged between any two of the plurality of opening groups including the light emitting portions for emitting different colors of light. In this way, when the light emitting functional layer is formed by the inkjet printing process, the luminescent material of different colors may be prevented from flowing into an opening group adjacent in the fourth direction D4.

Referring to FIG. 1 and FIG. 4 in combination, in the fourth direction D4, the first pixel defining portions 2 are arranged on two sides of the third pixel defining portion 6, respectively. For example, the third pixel defining portion 6 may be in contact with the first pixel defining portions 2 located on the two sides of the third pixel defining portion 6. Since the first pixel defining portion 2 is higher than the third pixel defining portion 6, a channel 61 may be formed above the third pixel defining portion 6 and between two adjacent first pixel defining portions 2. In this way, when the light emitting functional layer is formed by the inkjet printing process, the luminescent material of the same color may flow along the channel 61, so as to flow between the plurality of pixel openings between the plurality of opening groups including the light emitting portions for emitting the same color of light.

For example, a size W21 of the first pixel defining portion 2 in the first direction D1 is greater than a size W41 of the second pixel defining portion 4 in the first direction D1. A size W61 of the third pixel defining portion 6 in the fourth direction D4 is greater than the size W41 of the second pixel defining portion 4 in the first direction D1. The size W61 of the third pixel defining portion 6 in the fourth direction D4 is 1 to 6 times, for example, 1.5 to 4 times the size W21 of the first pixel defining portion 2 in the first direction D1.

For example, in some exemplary embodiments of the present disclosure, as shown in FIG. 1, the array substrate 100 may include a plurality of repetitive units PX. For example, a repetitive unit PX may include at least one first pixel opening 11, a first light emitting portion 51 located in the first pixel opening 11, a second pixel opening 12, a second light emitting portion 52 located in the second pixel opening 12, a third pixel opening 13, and a third light emitting portion 53 located in the third pixel opening 13. The plurality of repetitive units PX may be arranged on the base substrate 1 in an array in the first direction D1 and the second direction D2.

Exemplarily, the first direction D1 may be substantially perpendicular to the second direction D2. For example, the first direction D1 may be a column direction in which the repetitive units PX are arranged, and the second direction D2 may be a row direction in which the repetitive units PX are arranged. Alternatively, the first direction D1 may be the row direction in which the repetitive units PX are arranged, and the second direction D2 may be the column direction in which the repetitive units PX are arranged. These may be designed and determined according to actual requirements, and are not limited here.

In the embodiments of the present disclosure, each opening group includes two pixel openings, and the sub-pixels are staggered, which may improve a utilization rate of the base substrate, and further improve a resolution of an inkjet printed product, so that the quality and the lifetime of the display device may be further improved.

Figure 6:
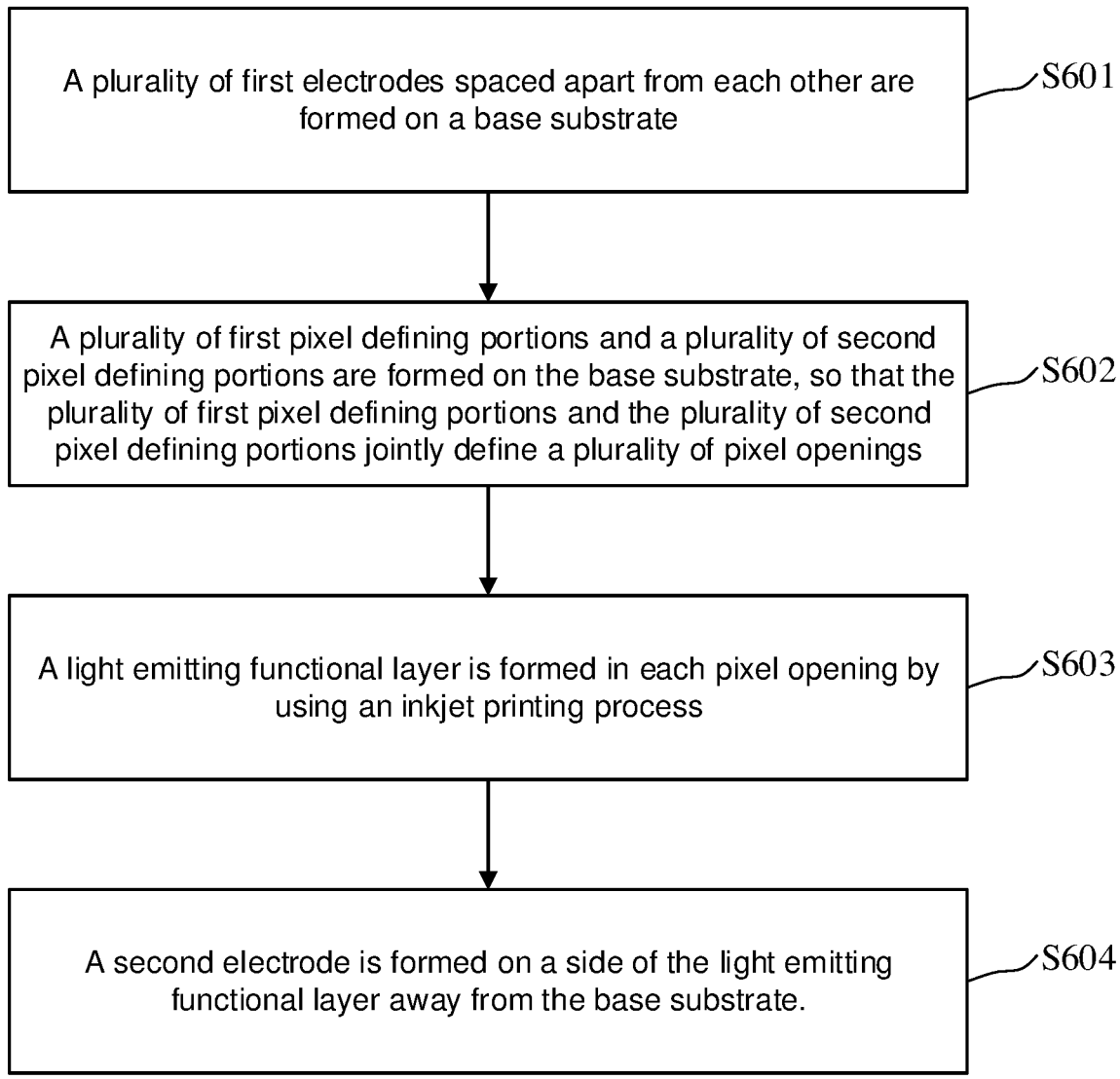
FIG. 6 shows a flowchart of a method of manufacturing an array substrate according to some embodiments of the present disclosure.

FIG. 6 shows a flowchart of a method of manufacturing an array substrate according to some embodiments of the present disclosure. Referring to FIG. 1 to FIG. 6 in combination, the method of manufacturing the array substrate according to the embodiments of the present disclosure may include following steps.

In step S601, a plurality of first electrodes 3 spaced apart from each other may be formed on the base substrate 1. For example, the plurality of first electrodes 3 spaced apart from each other may be formed on the base substrate 1 by using a patterning process. For example, the first electrode 3 may contain a conductive material such as ITO.

In step S602, a plurality of first pixel defining portions 2 and a plurality of second pixel defining portions 4 are formed on the base substrate 1, so that the plurality of first pixel defining portions 2 and the plurality of second pixel defining portions 4 jointly define a plurality of pixel openings.

In step S603, a light emitting functional layer 5 is formed in each pixel opening by using an inkjet printing process.

For example, orthographic projections of the plurality of pixel openings on the base substrate 1 are respectively located in orthographic projections of the plurality of first electrodes 3 on the base substrate 1. The plurality of pixel openings may include at least a first pixel opening 11 and a second pixel opening 12. The light emitting functional layer 5 may include at least a first light emitting portion 51 and a second light emitting portion 52 that emit different colors of light. At least a part of the first light emitting portion 51 is located in the first pixel opening 11, and at least a part of the second light emitting portion 52 is located in the second pixel opening 12.

At least one of the plurality of first pixel defining portions 2 is located between a first pixel opening 11 and a second pixel opening 12 that are adjacent in the first direction D1, and at least one of the plurality of second pixel defining portions 4 is located between two first pixel openings 11 that are adjacent in the first direction D1 or is located between two second pixel openings 12 that are adjacent in the first direction D1.

An orthographic projection of a combination of two adjacent pixel openings separated by the second pixel defining portion 4 on the base substrate 1 has a first size W1 in a first direction D1 and a second size W2 in a second direction D2. A ratio of the first size W1 to the second size W2 is within a range of 0.8 to 1.2.

In step S604, a second electrode 7 may be formed on a side of the light emitting functional layer 5 away from the base substrate 1. For example, the second electrode 7 may be formed by an evaporation process.

For example, in the embodiments of the present disclosure, prior to step S601, the method may further include forming a circuit structure layer on the base substrate 1.

For example, in step S602, the plurality of first pixel defining portions 2 and the plurality of second pixel defining portions 4 may be formed by using one patterning process.

For example, in step S602, the plurality of second pixel defining portions 4 may be formed firstly by using one patterning process, and then the plurality of first pixel defining portions 2 may be formed by another patterning process.

For example, in the embodiments of the present disclosure, in step S603, a hole injection layer 5A, a hole transport layer 5B and a luminescent material layer 5C may be formed by an inkjet printing process. An electron transport layer 5D and an electron injection layer 5E may be formed by an evaporation process.

For example, in the embodiments of the present disclosure, in a long side direction of the pixel opening, a film thickness of the light emitting functional layer 5 may have a relatively high uniformity, which may be, for example, 80% or more. Similarly, in a short side direction of the pixel opening, the film thickness of the light emitting functional layer 5 may also have a relatively high uniformity, which may be, for example, 80% or more.

The embodiments of the present disclosure further provide a display panel, which may include the array substrate described above. A principle of the display panel for solving problems is similar to a principle of the array substrate described above. Therefore, an implementation of the display panel may refer to the implementation of the array substrate described above, which will not be repeated here.

Figure 7:
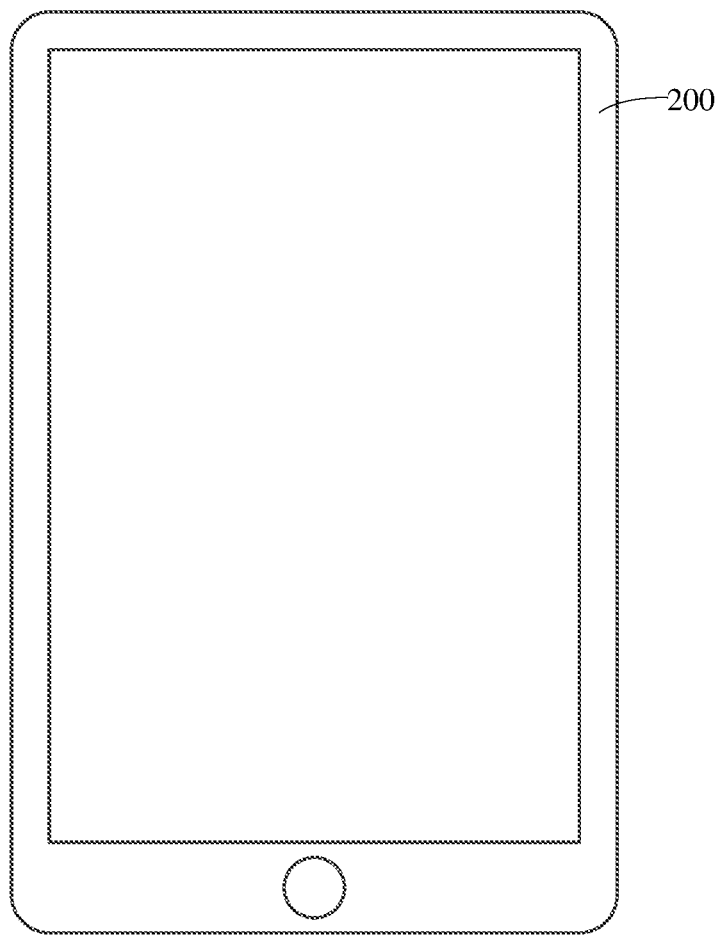
FIG. 7 shows a schematic plan view of a display device according to some embodiments of the present disclosure.

Referring to FIG. 7, the exemplary embodiments of the present disclosure further provide a display device 200 that may include the display panel described above. Examples of the display device include a tablet personal computer (PC), a smart phone, a personal digital assistant (PDA), a portable multimedia player, a game console, or a wrist watch-type electronic device, etc. However, the embodiments of the present disclosure are not intended to limit the type of the display device 200. In some exemplary embodiments, the display device 200 may be used not only in a large electronic device such as a television (TV) or an external billboard, but also in a medium or small electronic device such as a PC, a laptop computer, a vehicle navigation device or a camera.

The above are only specific embodiments of the present disclosure, however, the protection scope of the present disclosure is not limited thereto. Any changes or substitutions that may be easily envisaged by those skilled in the art within the technical scope disclosed in the present disclosure should be covered within the protection scope of the present disclosure. Therefore, the protection scope of the present disclosure should be determined by the protection scope defined by the claims.

What is claimed is:

1. An array substrate, comprising:
   a base substrate;
   a plurality of first electrodes arranged on the base substrate, wherein the plurality of first electrodes are spaced apart from each other;
   a plurality of first pixel defining portions arranged on the base substrate;
   a plurality of second pixel defining portions arranged on the base substrate, wherein the plurality of first pixel defining portions and the plurality of second pixel defining portions jointly define a plurality of pixel openings including at least a first pixel opening and a second pixel opening, and orthographic projections of the plurality of pixel openings on the base substrate are respectively located within orthographic projections of the plurality of first electrodes on the base substrate; and
   a light emitting functional layer arranged on the base substrate, wherein the light emitting functional layer comprises at least a first light emitting portion and a second light emitting portion that emit different colors of light, at least a part of the first light emitting portion is located in the first pixel opening, and at least a part of the second light emitting portion is located in the second pixel opening;
   wherein at least one of the plurality of first pixel defining portions is located between a first pixel opening and a second pixel opening that are adjacent in a first direction, and at least one of the plurality of second pixel defining portions is located between two first pixel openings that are adjacent in the first direction or is located between two second pixel openings that are adjacent in the first direction;
   wherein an orthographic projection of a combination of two adjacent pixel openings separated by the second pixel defining portion on the base substrate has a first size in the first direction and a second size in a second direction different from the first direction, and a ratio of the first size to the second size is within a range of 0.8 to 1.2;
   wherein the base substrate has a first surface facing the plurality of first electrodes, the first pixel defining portion has a first height in a direction perpendicular to the first surface, the second pixel defining portion has a second height in the direction perpendicular to the first surface, and the first height is greater than the second height;
   wherein the array substrate further comprises a plurality of third pixel defining portions, wherein at least one of the third pixel defining portions is located between two first pixel openings that are adjacent in a third direction or is located between two second pixel openings that are adjacent in the third direction, the third direction is different from the first direction and the second direction; and
   wherein the third pixel defining portion has a third height in the direction perpendicular to the first surface, and the first height is greater than the third height.

2. The array substrate of claim 1, wherein an orthographic projection of a combination of the second pixel defining portion and two adjacent pixel openings separated by the second pixel defining portion on the base substrate has a shape of a rhombus or a square.

3. The array substrate of claim 1, wherein a ratio of the third height to the second height is within a range of 0.8 to 1.2.

4. The array substrate of claim 1, wherein an orthographic projection of each of the first pixel opening and the second pixel opening on the base substrate has a long side extending in the second direction and a short side extending in the first direction; and
wherein the first size is equal to a sum of lengths of the short sides of two adjacent first pixel openings or two adjacent second pixel openings and a width of the second pixel defining portion separating the two adjacent first pixel openings or two adjacent second pixel openings in the first direction, and the second size is equal to a length of the long side of the first pixel opening or the second pixel opening.

5. The array substrate of claim 1, wherein orthographic projections of the plurality of first pixel defining portions on the base substrate extend continuously and have a bent shape; or
wherein an orthographic projection of each of the second pixel defining portions on the base substrate is in a strip shape extending in the second direction; or
wherein an orthographic projection of each of the third pixel defining portions on the base substrate is in a strip shape extending in the third direction.

6. The array substrate of claim 1, wherein the first pixel defining portions and the second pixel defining portions are alternately arranged in the first direction; or
wherein the first pixel defining portions and the second pixel defining portions are alternately arranged in the second direction.

7. The array substrate of claim 1, wherein the plurality of pixel openings further comprise a third pixel opening, the light emitting functional layer further comprises a third light emitting portion, the first light emitting portion, the second light emitting portion and the third light emitting portion emit different colors of light, and at least a part of the third light emitting portion is located in the third pixel opening; and
wherein at least one of the first pixel defining portions is arranged between any adjacent two of the first pixel opening, the second pixel opening and the third pixel opening.

8. The array substrate of claim 1, wherein the array substrate further comprises two third pixel openings that are adjacent in the first direction, and at least one of the second pixel defining portions is arranged between the two third pixel openings; and
wherein in the first direction, the first pixel defining portion is arranged between any adjacent two of a combination of two adjacent first pixel openings, a combination of two adjacent second pixel openings and a combination of two adjacent third pixel openings that are respectively separated by the second pixel defining portion.

9. The array substrate of claim 8, wherein in the third direction, the third pixel defining portion is arranged between two adjacent first opening groups; or
wherein in the third direction, the third pixel defining portion is arranged between two adjacent second opening groups; or
wherein in the third direction, the third pixel defining portion is arranged between two adjacent third opening groups.

10. The array substrate of claim 9, wherein in a fourth direction perpendicular to the third direction, the first pixel defining portion is arranged between the third pixel defining portion and each of the first opening group, the second opening group and the third opening group.

11. The array substrate of claim 10, wherein a size of the first pixel defining portion in the first direction is greater than a size of the second pixel defining portion in the first direction; or
a size of the third pixel defining portion in the fourth direction is greater than the size of the second pixel defining portion in the first direction; or
the size of the third pixel defining portion in the fourth direction is 1 to 6 times the size of the first pixel defining portion in the first direction.

12. A display panel comprising the array substrate of claim 1.

13. A display device comprising the display panel of claim 12.

14. A method of manufacturing an array substrate, comprising:
forming a plurality of first electrodes on a base substrate, wherein the plurality of first electrodes are spaced apart from each other;
forming a plurality of first pixel defining portions and a plurality of second pixel defining portions on the base substrate, so that the plurality of first pixel defining portions and the plurality of second pixel defining portions jointly define a plurality of pixel openings; and
forming a light emitting functional layer in each of the pixel openings by using an inkjet printing process,
wherein orthographic projections of the plurality of pixel openings on the base substrate are respectively located in orthographic projections of the plurality of first electrodes on the base substrate, the plurality of pixel openings comprise at least a first pixel opening and a second pixel opening, the light emitting functional layer comprises at least a first light emitting portion and a second light emitting portion that emit different colors of light, at least a part of the first light emitting portion is located in the first pixel opening, and at least a part of the second light emitting portion is located in the second pixel opening;
wherein at least one of the plurality of first pixel defining portions is located between a first pixel opening and a second pixel opening that are adjacent in a first direction, and at least one of the plurality of second pixel defining portions is located between two first pixel openings that are adjacent in the first direction or is located between two second pixel openings that are adjacent in the first direction;
wherein an orthographic projection of a combination of two adjacent pixel openings separated by the second pixel defining portion on the base substrate has a first size in the first direction and a second size in a second direction different from the first direction, and a ratio of the first size to the second size is within a range of 0.8 to 1.2;
wherein the base substrate has a first surface facing the plurality of first electrodes, the first pixel defining portion has a first height in a direction perpendicular to the first surface, the second pixel defining portion has a second height in the direction perpendicular to the first surface, and the first height is greater than the second height;
wherein the method further comprises: forming a plurality of third pixel defining portions on the base substrate, wherein at least one of the third pixel defining portions is located between two first pixel openings that are adjacent in a third direction or is located between two second pixel openings that are adjacent in the third direction, the third direction is different from the first direction and the second direction; and wherein the third pixel defining portion has a third height in the direction perpendicular to the first surface, and the first height is greater than the third height.

* * * * *